(12) United States Patent
Roberts et al.

(10) Patent No.: US 10,694,630 B2
(45) Date of Patent: Jun. 23, 2020

(54) CASE FOR A MOBILE COMMUNICATIONS DEVICE WITH A SCREEN

(71) Applicant: Tech 21 Licensing Limited, Twickenham (GB)

(72) Inventors: Jason Roberts, Twickenham (GB); Benjamin Thorpe, Uxbridge (GB)

(73) Assignee: TECH 21 LICENSING LIMITED, Middlesex, Twickenham (GB)

( * ) Notice: Subject to any disclaimer, the term of this patent is extended or adjusted under 35 U.S.C. 154(b) by 0 days.

(21) Appl. No.: 15/591,875

(22) Filed: May 10, 2017

(65) Prior Publication Data
US 2018/0332724 A1   Nov. 15, 2018

(51) Int. Cl.
*H05K 5/02* (2006.01)
*H04B 1/3888* (2015.01)
*A45C 11/00* (2006.01)

(52) U.S. Cl.
CPC ......... *H05K 5/0221* (2013.01); *H04B 1/3888* (2013.01); *A45C 2011/002* (2013.01)

(58) Field of Classification Search
CPC ...... G06F 1/1626; G06F 1/1628; G06F 1/166; G06F 2200/1632–1634; A45C 2011/002; A45C 2011/003; A45C 2200/15; A45C 11/00; H04B 1/3888; H05K 5/0221
USPC ........ 206/320, 45.2, 37, 579, 751, 755, 762, 206/764, 45.21, 305, 472–475, 206/45.23–45.26, 45.28; 220/4.22–4.23, 220/810, 812–813, 816, 836–837, 840, 220/350; 361/679.01, 679.14–679.15, 361/FOR. 103
See application file for complete search history.

(56) References Cited

U.S. PATENT DOCUMENTS

| | | | | |
|---|---|---|---|---|
| 5,128,829 A | * | 7/1992 | Loew | G06F 1/1626 16/225 |
| 6,634,494 B1 | * | 10/2003 | Derr | G01D 11/24 206/305 |
| 6,967,836 B2 | * | 11/2005 | Huang | A45C 3/02 361/679.46 |
| 7,318,521 B2 | * | 1/2008 | Lau | A45C 11/00 206/320 |
| 7,584,841 B2 | * | 9/2009 | Chan | A45C 11/00 206/305 |
| 8,132,670 B1 | * | 3/2012 | Chen | A45C 11/00 206/320 |

(Continued)

*Primary Examiner* — Chun Hoi Cheung
*Assistant Examiner* — Brijesh V. Patel
(74) *Attorney, Agent, or Firm* — Stephen J. Weyer, Esq.; Stites & Harbison, PLLC (57) ABSTRACT

A case for a mobile communications device includes a main body and a cover. The main body defines a cavity to receive the device. The cover includes a cover portion selectively covering the cavity and a connection portion to connect the cover portion to the main body. The cover portion is formed, at least partially, of a flexible sheet. A free edge of the cover portion adjacent to the side wall opposite the connection portion is provided with a tab which is an extension of the flexible sheet material forming a cover portion. A stud fastener is fixed to the tab. Either the top, bottom or one of the side walls of the main body has an opening. When the cover portion is in its closed position, the tab moves so that the stud enters the opening and is resiliently deformed to hold the stud in the opening.

4 Claims, 8 Drawing Sheets

(56) References Cited

U.S. PATENT DOCUMENTS

| | | | | |
|---|---|---|---|---|
| 8,490,783 B1* | 7/2013 | Fan | | H04M 1/185 |
| | | | | 206/45.23 |
| 8,727,116 B2* | 5/2014 | Kim | | A45C 3/001 |
| | | | | 206/320 |
| 8,749,960 B2* | 6/2014 | Mori | | H05K 5/0086 |
| | | | | 248/346.03 |
| D714,550 S * | 10/2014 | Yoo | | D3/269 |
| 8,899,415 B2* | 12/2014 | McCosh | | G06F 1/166 |
| | | | | 206/320 |
| 8,929,057 B2* | 1/2015 | Rauta | | H04B 1/3888 |
| | | | | 206/301 |
| 8,976,536 B2* | 3/2015 | French, Jr. | | H05K 7/1427 |
| | | | | 16/221 |
| 9,010,537 B2* | 4/2015 | Carnevali | | G06F 1/1628 |
| | | | | 206/777 |
| D734,761 S * | 7/2015 | Ballou | | D14/440 |
| 9,078,338 B2* | 7/2015 | Ohtaka | | H05K 7/00 |
| D745,013 S * | 12/2015 | Brierley | | D14/440 |
| 9,380,723 B2* | 6/2016 | Rayner | | G06F 1/1626 |
| D765,639 S * | 9/2016 | Lay | | D14/250 |
| D776,645 S * | 1/2017 | Del Moral | | D14/250 |
| D777,421 S * | 1/2017 | Grote | | D14/250 |
| 9,559,741 B2* | 1/2017 | Rayner | | H01H 13/06 |
| 2004/0173482 A1* | 9/2004 | Nieves | | A45C 11/00 |
| | | | | 206/320 |
| 2004/0240164 A1* | 12/2004 | Lee | | G06F 1/1616 |
| | | | | 361/679.55 |
| 2006/0007645 A1* | 1/2006 | Chen | | G06F 1/1626 |
| | | | | 361/679.04 |
| 2008/0237432 A1* | 10/2008 | Patterson | | A45C 11/00 |
| | | | | 248/458 |
| 2009/0009945 A1* | 1/2009 | Johnson | | G06F 1/1613 |
| | | | | 361/679.27 |
| 2010/0238119 A1* | 9/2010 | Dubrovsky | | G06F 1/1626 |
| | | | | 345/169 |
| 2010/0294683 A1* | 11/2010 | Mish | | A45C 11/00 |
| | | | | 206/320 |
| 2011/0034221 A1* | 2/2011 | Hung | | A45C 11/00 |
| | | | | 455/575.8 |
| 2011/0297564 A1* | 12/2011 | Kim | | A45C 11/00 |
| | | | | 206/320 |
| 2012/0043235 A1* | 2/2012 | Klement | | A45C 11/00 |
| | | | | 206/320 |
| 2012/0212896 A1* | 8/2012 | Schulz | | A45C 11/00 |
| | | | | 361/679.02 |
| 2012/0234716 A1* | 9/2012 | Chen | | G06F 1/1626 |
| | | | | 206/472 |
| 2012/0287565 A1* | 11/2012 | Bennett, Jr. | | A45C 11/00 |
| | | | | 361/679.01 |
| 2012/0298536 A1* | 11/2012 | Rauta | | G06F 1/1656 |
| | | | | 206/301 |
| 2013/0213838 A1* | 8/2013 | Tsai | | G06F 1/1633 |
| | | | | 206/320 |
| 2013/0264235 A1* | 10/2013 | Lin | | A45C 11/00 |
| | | | | 206/320 |
| 2013/0334071 A1* | 12/2013 | Carnevali | | H05K 5/03 |
| | | | | 206/37 |
| 2014/0202890 A1* | 7/2014 | Oten | | A45C 11/00 |
| | | | | 206/45.24 |
| 2014/0216954 A1* | 8/2014 | Law | | A45F 5/02 |
| | | | | 206/45.23 |
| 2014/0291176 A1* | 10/2014 | Chung | | G06F 1/1656 |
| | | | | 206/45.23 |
| 2014/0347814 A1* | 11/2014 | Zaloom | | G06F 1/1626 |
| | | | | 361/679.56 |
| 2015/0195931 A1* | 7/2015 | Roberts | | G06F 1/1613 |
| | | | | 220/810 |
| 2016/0029759 A1* | 2/2016 | Mulhern | | A45C 11/00 |
| | | | | 206/45.23 |
| 2016/0157573 A1* | 6/2016 | Del Moral | | H04M 1/185 |
| | | | | 224/191 |
| 2016/0211877 A1* | 7/2016 | Poon | | H04B 1/3888 |
| 2016/0316872 A1* | 11/2016 | Huang | | H04M 1/185 |

* cited by examiner

CASE FOR A MOBILE COMMUNICATIONS DEVICE WITH A SCREEN

FIELD OF THE INVENTION

The present invention relates to a case for a mobile communications device with a screen.

BACKGROUND OF THE INVENTION

Many cases for mobile devices are provided with a body and a cover which is generally hinged at one side of the body such that it can be folded across the body to cover the screen of the device.

Most of the cases of this type that we are aware which provide a means of fastening the cover to the body when the cover is closed use a tab extending away from the free edge of the cover (i.e. the edge opposite to the edge about which the cover is hinged). This tab extends around the side wall of the device such that an engagement feature on the tab engages with a complimentary engagement feature on the back of the case. Such engagement features are typically magnets, poppers or Velcro. These latches suffer from a number of drawbacks. Because the tab has extend round to the back of the device, it projects quite a long way from the fee edge of the cover. This is a nuisance during use when the cover is open as this tab will get in the way of the user handling and using their device. Also, a further component and hence a further manufacturing step is required in order to include an engagement feature on the rear of the back wall. This also adds bulk and potential snagging hazard to the phone case.

We aware of two cases one produced by the applicant as the "Evo Wallet Case" for the iPhone 6 and another manufactured by Gear4 under the model name "Oxford" which take a different approach. These have a rigid tab downwardly depending from the free edge of the cover which has groove which is intended to engage with a rib on a side wall of the case. This design suffers from a number of drawbacks. Because the tab is rigid and extends directly away from the cover, it is worse than the above-mentioned longer tabs in terms of getting in the way of using the device. Also, because it is rigid and extends away from the cover, it is very easy to snap off or to plastically deform to such an extent that it will no longer engage with the rib on the side of the case. In addition, the engagement force between the tab and the case is very small even when new and is likely to quickly degrade with use.

SUMMARY OF THE INVENTION

The present invention is directed to a case with a body and cover which has a reliable, low profile and low cost fastening mechanism. In one form, the present invention relates to an improved coupling between the cover and the body.

According to the present invention, in one form, there is provided a case for a mobile communications device with a screen, the case comprising main body and a cover;

the main body having a generally rectangular configuration comprising a back wall with a top edge and a bottom edge and a pair of side edges extending substantially perpendicular to the top and bottom edges, top and bottom walls extend away from the top and bottom edges and side walls extend away from the side edges such that the four walls define, with the back wall, a cavity to receive the device;

the cover comprising a cover portion arranged to selectively cover the front of the cavity in a closed position and a connection portion to connect the cover portion to the body so that the cover portion can be moved between its closed position in which it covers the cavity and an open position in which the cavity is accessible;

the cover portion being formed, at least partially, of a flexible sheet of material, the free edge of the cover portion adjacent to the side wall opposite the connection portion being provided with a tab which is an extension of the flexible sheet material forming the cover portion;

a stud fastener being fixed to the tab;

one of the top wall, the bottom wall or one of the side walls of the main body adjacent to the tab with the cover in the closed position being provided with an opening;

the main body in the vicinity of the opening being formed of a first resilient material and the stud being formed of a material which is harder than the resilient material; and the opening being positioned, in use, so that when the cover portion is in the closed position, the tab can be moved so that the stud enters the opening and resiliently deforms the material in the vicinity of the opening to hold the stud in the opening in a secured configuration.

According to the present invention, in another form thereof, there is provided a case for a mobile communications device with a screen, the case comprising:

a main body and a cover;

the main body having a generally open front rectangular box shape comprising a back wall and a top, a bottom and two opposing side walls extending upward from the back wall, thereby defining a cavity to receive the device;

the cover comprising a cover portion arranged to selectively cover the front of the main body over the cavity, when in a closed position, and a connection portion to connect the cover portion to the body so that the cover portion can be moved between its closed position and an open position in which the cavity is accessible;

the cover portion being formed, at least partially, of a flexible sheet of material, a free edge of the cover portion adjacent to the side wall opposite the connection portion being provided with a tab which is an extension of the flexible sheet material forming the cover portion;

a stud fastener being fixed to the tab;

one of the top, the bottom or one of the side walls of the main body having an opening, in a location adjacent to the tab, when the cover portion is in its closed position;

the main body in a vicinity of the opening being formed of a first resilient material and the stud being formed of a material which is harder than the resilient material; and the opening being disposed in a location such that, when the cover portion is in its closed position, the tab can be moved so that the stud enters the opening and resiliently deforms the material in the vicinity of the opening to hold the stud in the opening in a secured configuration.

The claimed arrangement has a number of important benefits. Firstly, it can be manufactured very cheaply. The part of the fastening mechanism on the main body is simply a hole in the wall which is formed as part of the moulding process, avoiding the need for any further components or assembly steps. The only additional component required for the fastening mechanism is the stud which is fitted into a tab which itself is an extension of the cover portion.

The tab is a flexible component which is typically less than half the size of all of the flexible tabs in the prior art which have to engage with the rear face of the back wall. Because it is small and flexible, it interferes far less with the usual operation of the case.

Further, because it does not extend around the back of the device and has a positive engagement with the wall. It provides a low profile connection which is also very robust. It is therefore unlikely to be accidently dislodged or to be caught on other items in a bag or pocket of user in use. Not only that, but the engagement of the relatively hard stud within the resilient wall material provides a reliable connection which will not degrade a great deal over time.

The present case therefore provides numerous benefits over the prior art.

Preferably the stud comprises a connection head which projects from the side of the tab which, in the closed configuration faces the body, and a neck portion in the form of a restriction between the head and the tab; the opening being provided with a narrow entrance and an enlarged portion behind the narrow entrance, wherein as the stud is moved to the secured configuration the head enters the opening, resiliently deforming the material of the narrow entrance allowing the head to pass through the narrow entrance until the neck is located in the narrow entrance and is held in place by the resilience of the material. This provides a simple but robust engagement between the stud and the spring

BRIEF DESCRIPTION OF THE DRAWINGS

An example of a case in accordance with the present invention will now be described with reference to the accompanying drawings, in which:

FIG. 3 is a perspective view showing the connection portion in a preliminary position with FIG. 3A showing a detail of FIG. 3;

FIG. 4 is a perspective view showing the connection portion in a first position with FIG. 4A showing a detail of FIG. 4;

FIG. 5 is a perspective view showing the connection portion in a second position with FIG. 5A showing a detail of FIG. 5.

DETAILED DESCRIPTION

The wallet comprises two main portions, the first of which is a case which largely corresponds to a conventional five sided case for a mobile electronic device.

Figure 2:
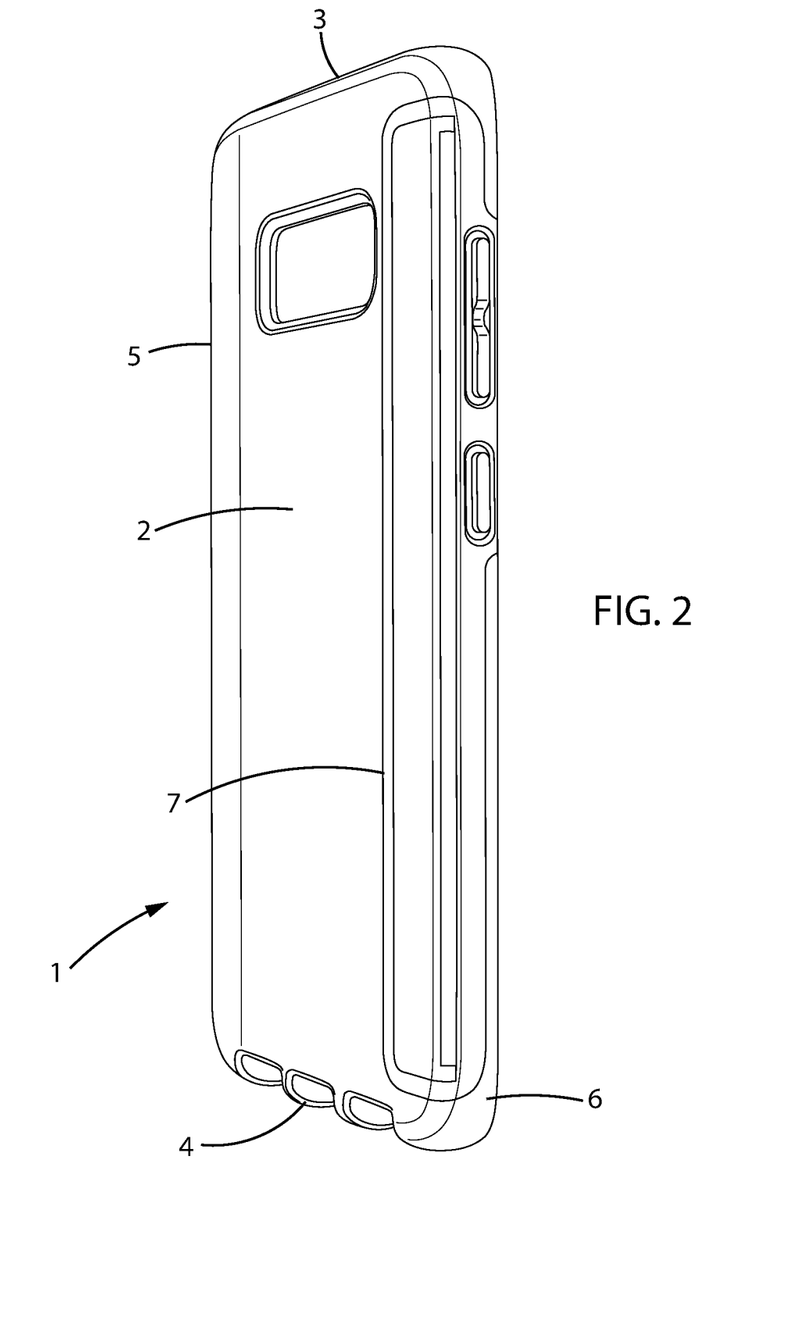
FIG. 2 is a rear perspective view of the wallet with a blank inserted in place of the cover.

The second component may either be a cover as described below or a blank as illustrated in FIG. 2. This will be described in greater detail below, but the only difference is that the cover has a portion which wraps around the front of the wallet while the blank does not. The blank illustrated in FIG. 2 can equally be provided with the latching mechanism of the cover as described below.

As mentioned above, the case 1 may have a generally conventional design for most of its features including the various orifices for the buttons, port, lenses, lights and speakers for the mobile electronic device. The case has a well-known five-sided configuration comprising a back 2, top side 3, bottom side 4, right side 5 and left side 6.

A recess 7 (best shown in FIG. 3A) is provided in the back of the case. This recess extends for most of the full height of the back of the case 1 and extends approximately a quarter of the way across the width of the back 2. The left side 6 can remain largely unaffected by the modification such that it retains ports and switches found on an unmodified case. The only part of the side 6 which may be affected by this modification is the part which lies in the plane of the back 2 which is absent as described below.

The cover 10 comprises three main portions, a cover portion 11, a flexible intermediate portion 13 and a connection portion 14 (see, e.g., FIGS. 6A-6D). The cover portion 11 configured to cover the screen of the mobile device. The cover portion 11 then extends into-a the flexible intermediate portion 13 which wraps around the left side 6 in the closed position.

Figure 1:
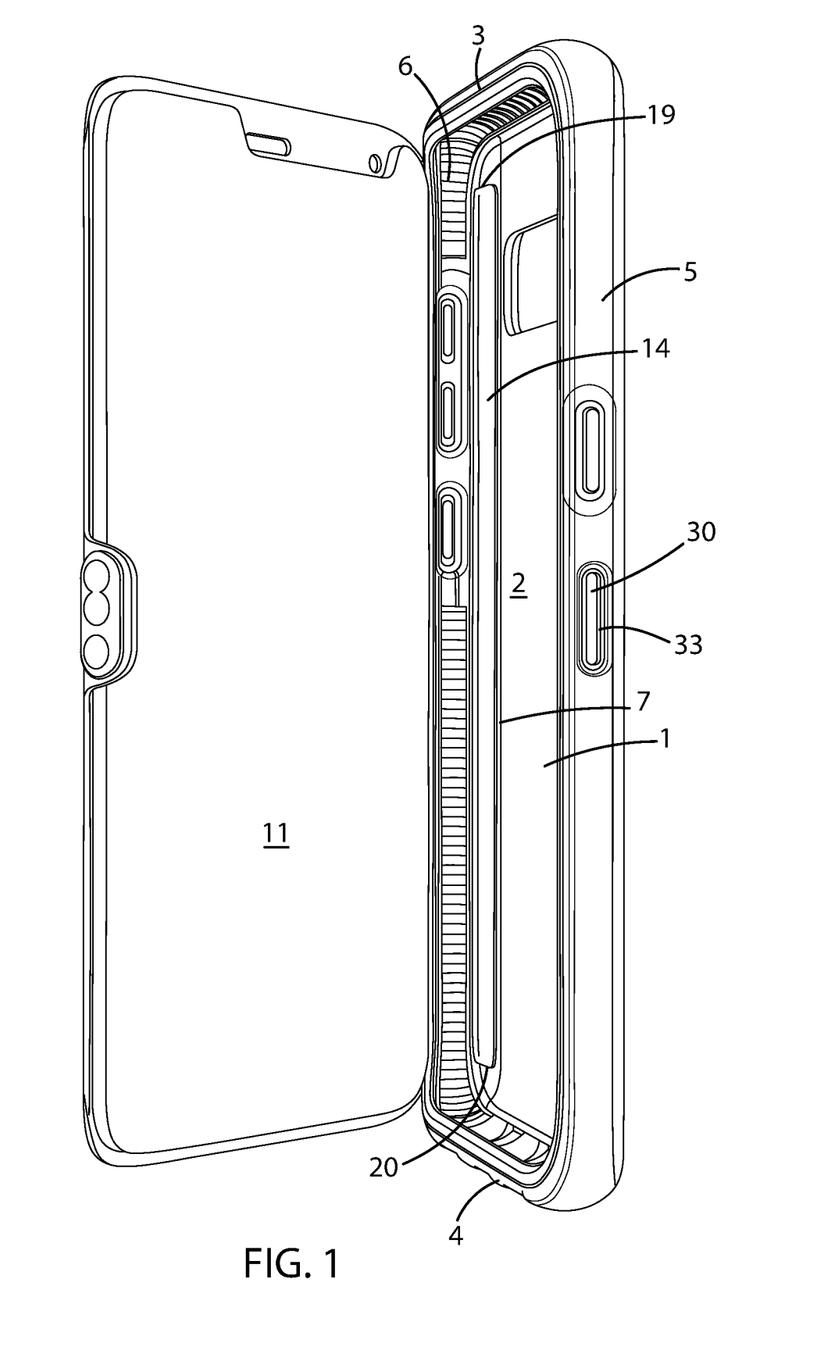
FIG. 1 is a perspective view of the case with the cover open.
Figure 7:
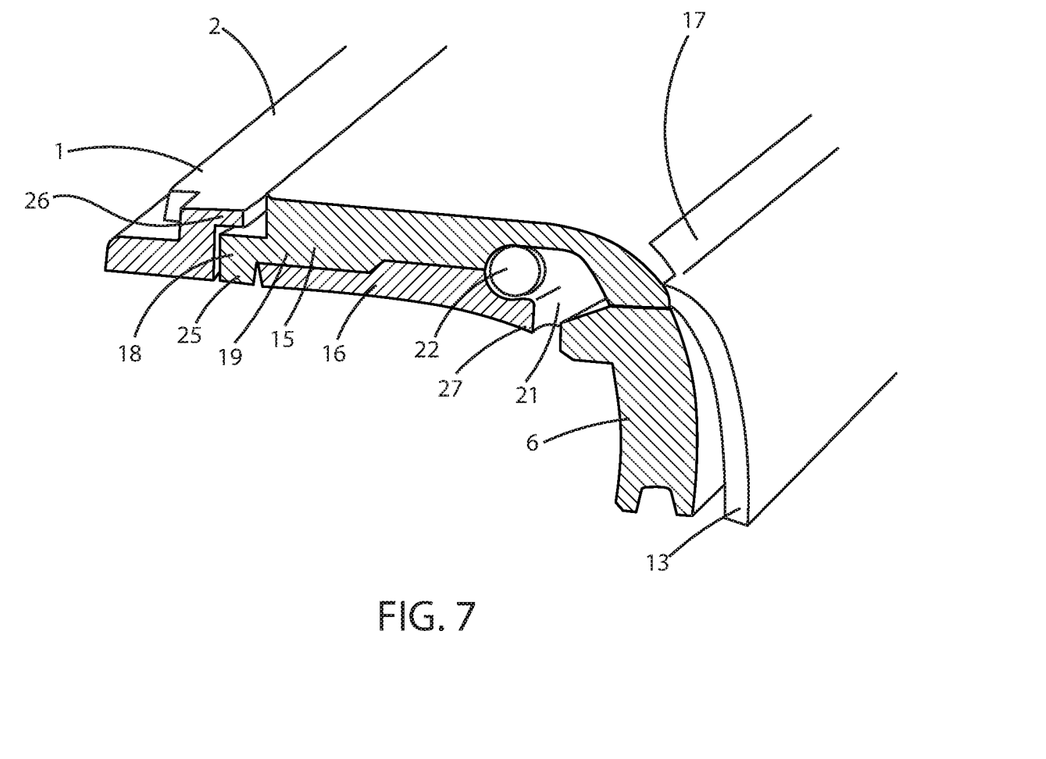
FIG. 7 is a cut-away perspective view showing a portion of the case, cover and connection portion.

The third part of the cover 10 is the connection portion 14. This is a rigid portion made in two pieces 15, 16 as best shown in FIG. 7. These two pieces sandwich the intermediate portion 13 between them to retain it in place. This defines a first edge 17 opposite to which is a free second edge 18. A top edge 19 and a bottom edge 20 extend between the first and second edges as best shown in FIGS. 1 and 3.

The top edge 19 is shown in FIG. 7, although the bottom edge 20 corresponds to this. The top edge 19 is provided with a slot 21 leading to a recess 22. The case is provided with a complimentary projection 23 as best shown in 6A to 6D. The projection 23 is designed to slide along the slot 21 and into the recess 22 into which it is a snap fit. It will be understood that this arrangement can be inverted at one or both ends such that the slot is provided in the case and the projection is provided on the connection portion 14.

Figures 3, 3A, 4, 4A, 5, 5A:
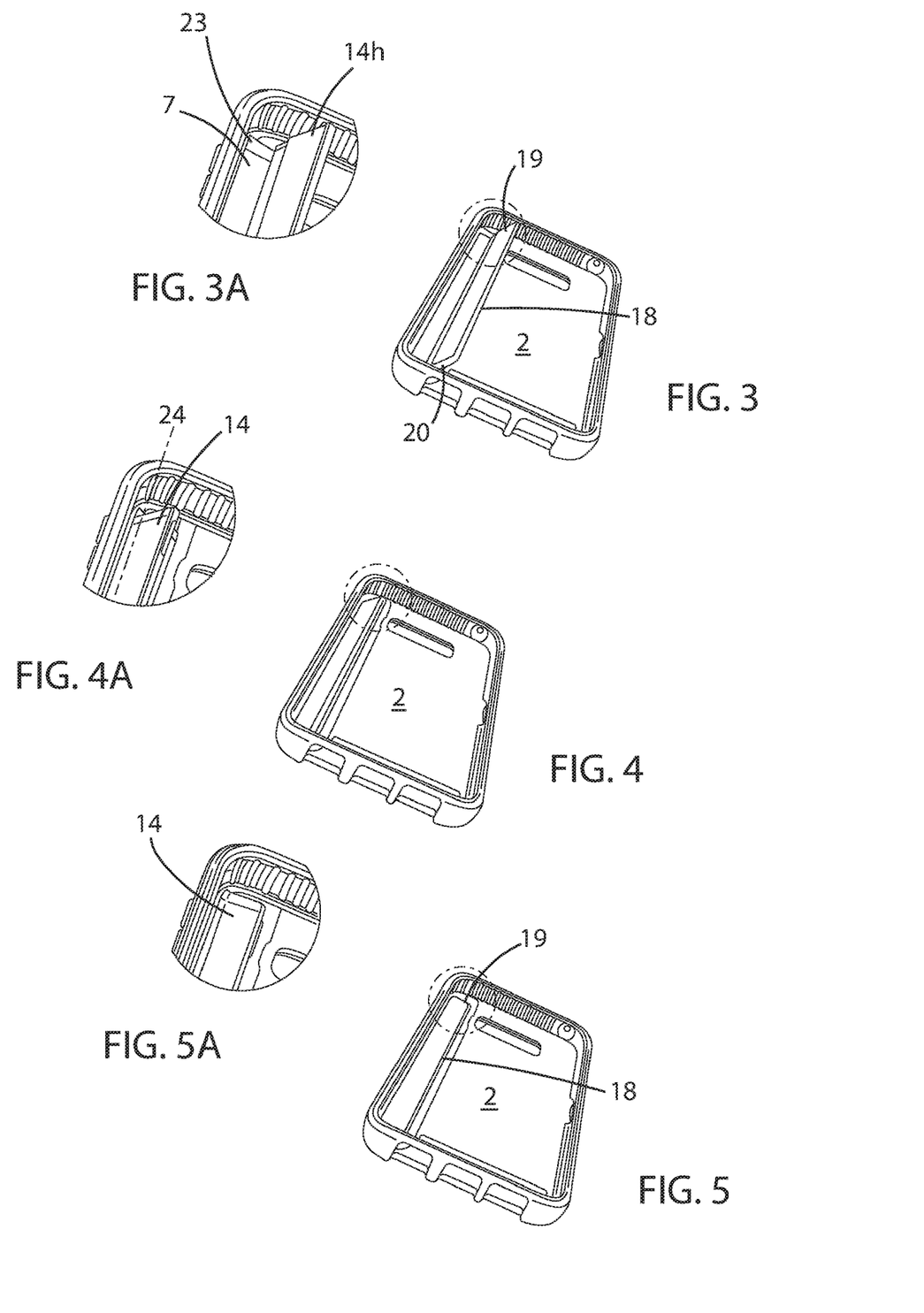
Figures 6A, 6B:
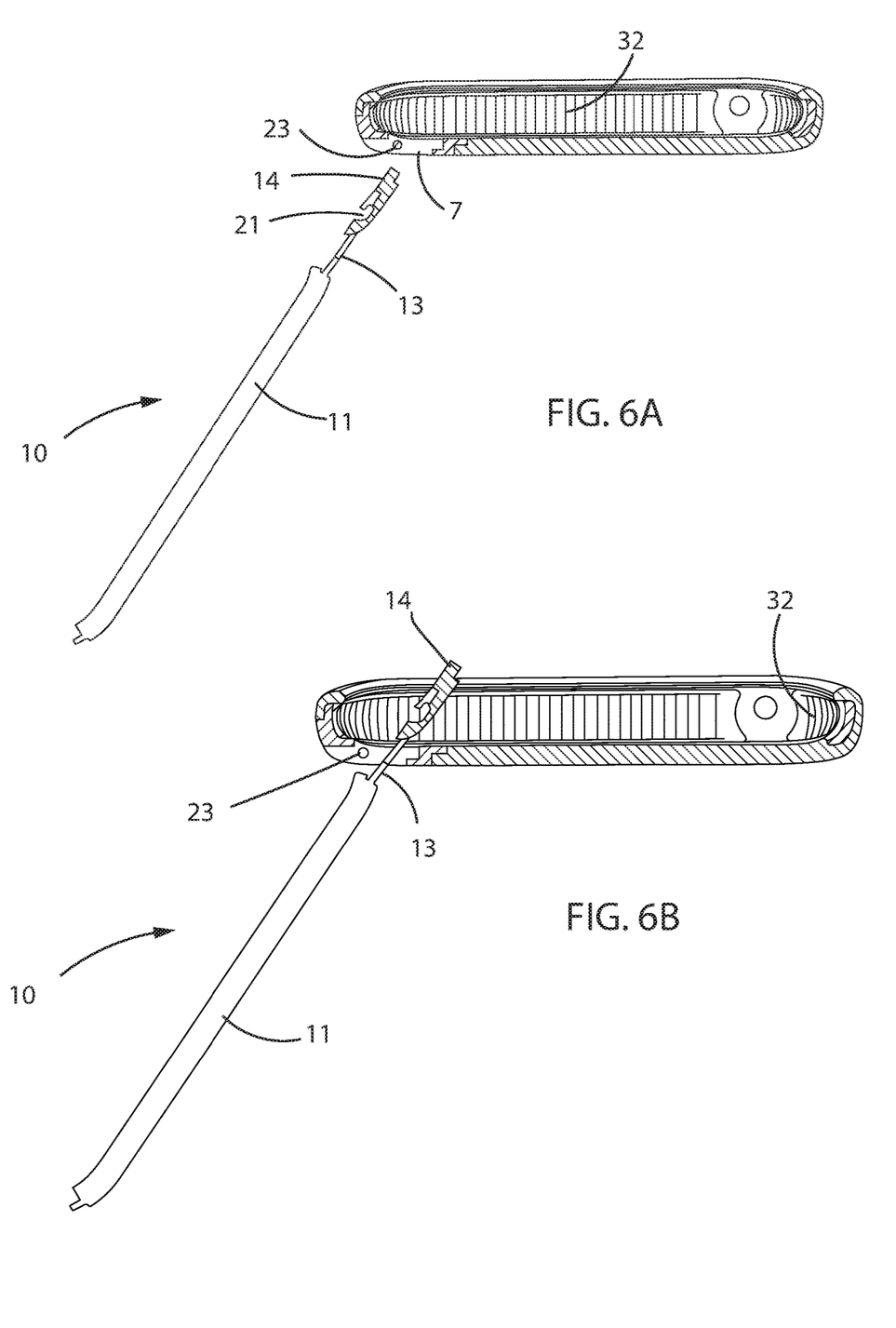
FIG. 6A is a schematic cross section showing the case and cover (without the tab) separate from one another.
FIG. 6B is a similar view showing the case and cover in the preliminary position shown in FIG. 3.
Figure 6C:
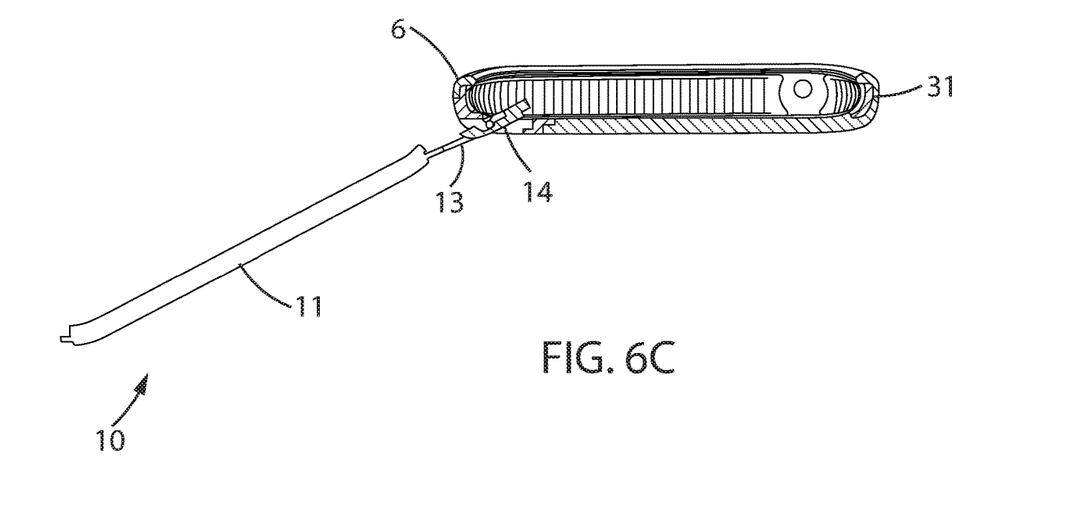
FIG. 6C is a similar view showing the case and cover in the first position as shown in FIG. 4.

In order to attach the cover 10 to the case 1, the connection portion 14 is pushed through the connection recess 7 initially pushing the slot 21 past the projection 23 in the position shown in FIGS. 3A and 6B. In this position, the recess 7 is long enough to receive the connection portion provided that it is inserted in a position away from the projections 23. The connection portion 14 is then pulled back to the position shown in FIGS. 4 and 4A and 6C in which the projections 23 enter the slots 21 and then snap into the recesses 21. This prevents the connection portion 14 from moving in anything other than a pivotal movement in which the connection portion 14 rotates about an axis 24 shown in FIG. 4A defined by the projections 23. The connection portion 14 is then rotated by the user into the second position shown in FIGS. 5, 5A and 6D in which the connection portion 14 fills the connection recess 7 and is flush with it. In this position, once the device is placed in the cavity in normal use, the connection portion cannot be rotated back to the first position. Further, the engagement between the recesses 22 and projections 23 prevents the connection portions 14 from being pulled out of the slot directly.

Further, as is apparent from FIG. 7, the second edge 18 of the connection portion 14 is provided with a lip 25 that engages behind a corresponding lip 26 formed in the back 2 of the case 1 preventing further pivotal motion of the connection portion 14 in the opposite direction.

A lip 27 on the inner face of the first edge 17 engages with the bottom edge of the wall to further secure the connection portion in place.

In order to remove the cover 10 from the case 1, the device first has to have been removed from the case. The engagement process described in FIGS. 3 to 5 (and 6A to 6D) is then reversed such that the connection portion is first pivoted to the first position shown in FIGS. 4 and 6C and is then pushed forward into the position shown in FIGS. 3 and 6B to disengage the projections 23 from the recesses 22. Sufficient force is required here in order to deflect the protrusions 23 such that they are forced out of the recesses 22 and along the slots 21.

The cover can then be replaced by a further cover or by the blank shown in FIG. 2 which is fitted in the same way.

Figure 6D:
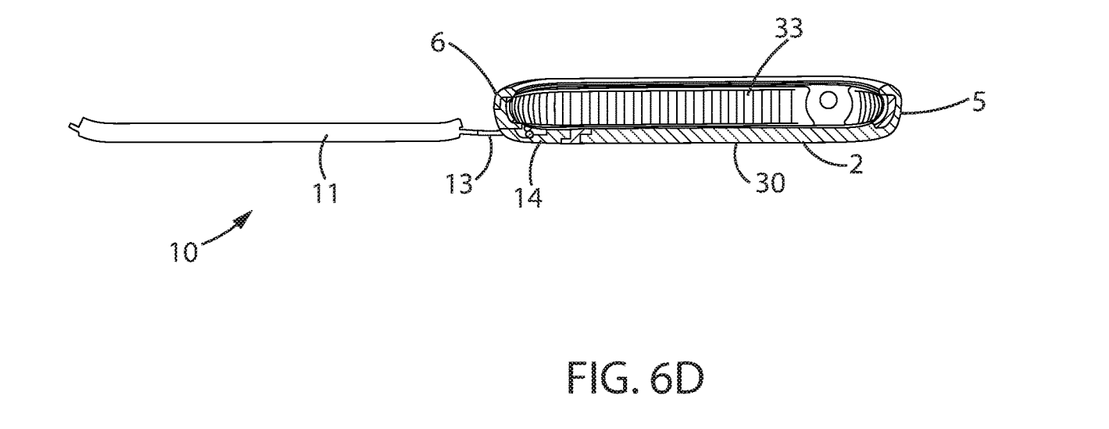
FIG. 6D is similar view showing the case and cover in the second position as shown in in FIG. 5.

This provides a very secure connection between the wallet and the cover which, as can be seen from FIG. 6D, will not extend between the usual envelope occupied by an unmodified case. Further, because the connection portion 14 is only made up of two moulded components, with the remaining features required to make the connection being moulded features either of the case or the connection portion, the wallet provides a low cost solution.

The particular construction of the case shown in FIG. 6A to 6D. This comprises a three part material which results in a three layer structure forming the majority of the side wall as shown for side wall 5 in FIG. 6A to D. This three part structure comprises an outer layer 30 of flexible polymer, and intermediate or dissipation layer 31 composed of dissipation material and an inner or damping layer 32 composed of damping material.

The outer layer 30 of flexible polymer may be TPU, TPE or silicone. This material will form the majority of the back.

The dissipation layer 31 may be PC, ABS, PC/ABS blends, Hard TPU grades, glass and fibre-filled rigid thermoplastics, nylon, glass and fibre-filled nylons and similar materials.

The inner layer 32 may be a soft elastomer, soft TPU, TPE, silicone, foam or the like. The inner layer 32 has a number of inwardly projecting ribs 33 which are configured to contact the device D such that there is generally no contact between the device and the case in the regions where the damping material is present other than through the ribs.

As can be seen in FIG. 6A to D, the dissipation layer 31 also extends to the vicinity of the recess 7. It is arranged to form the perimeter of the recess at 7 as well as forming the projection 23. If the projection is provided in the connection portion, and the slot is provided in the case, then the slot can be formed of the dissipation layer 31. This ensures that a relatively ridged material forms the recess 7 and also provides engagement with the intermediate portion. This provides a more robust connection that using a softer material providing a more reliable connection which is less prone to damage.

The novel latching mechanism forming the subject of the present invention will now be described with reference to FIGS. 8 and 8A to 8C.

Figure 8:
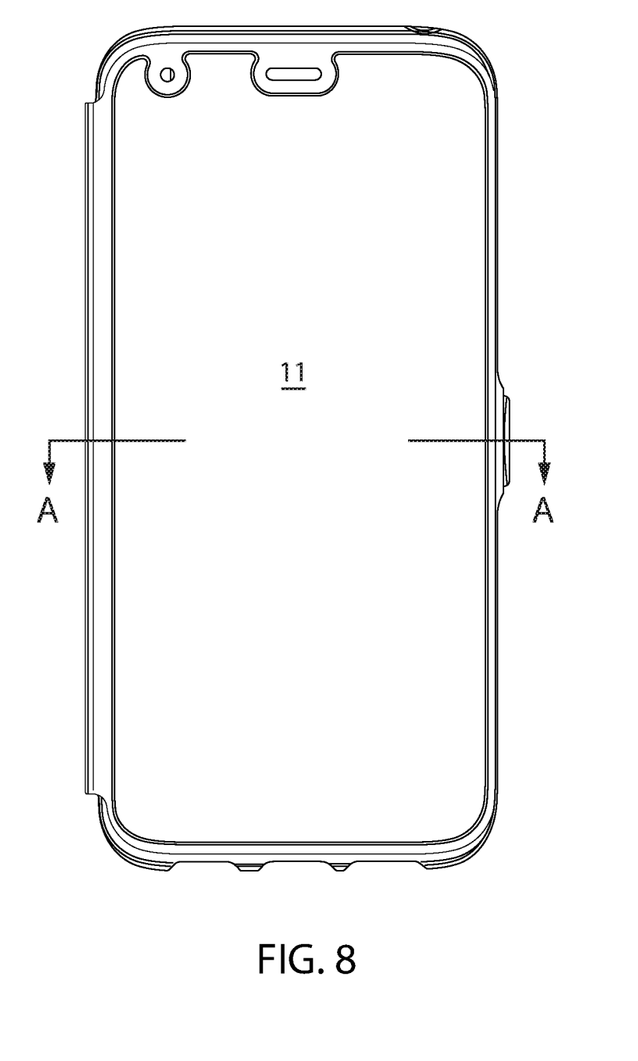
FIG. 8 is a plan view of the case with the cover closed.
Figure 8A:
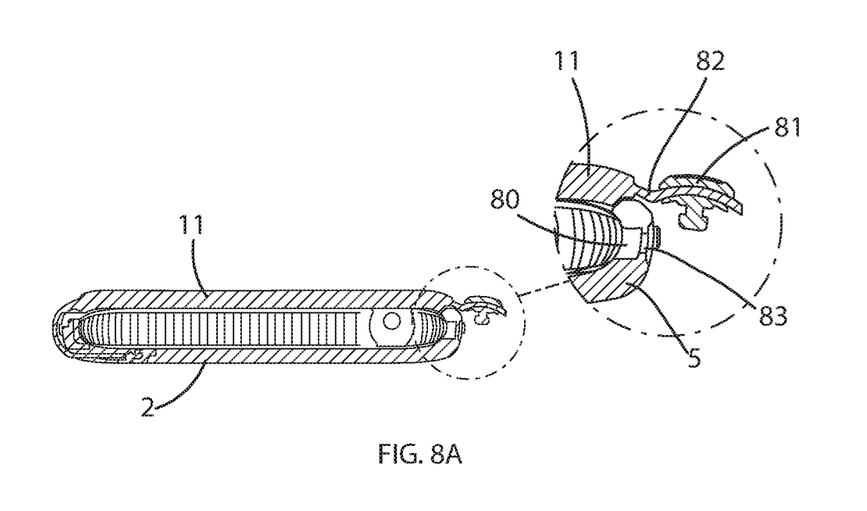
FIG. 8A is a cross section through A-A in FIG. 8 additionally showing the detail of the fastening device in a first position.
Figure 8B:
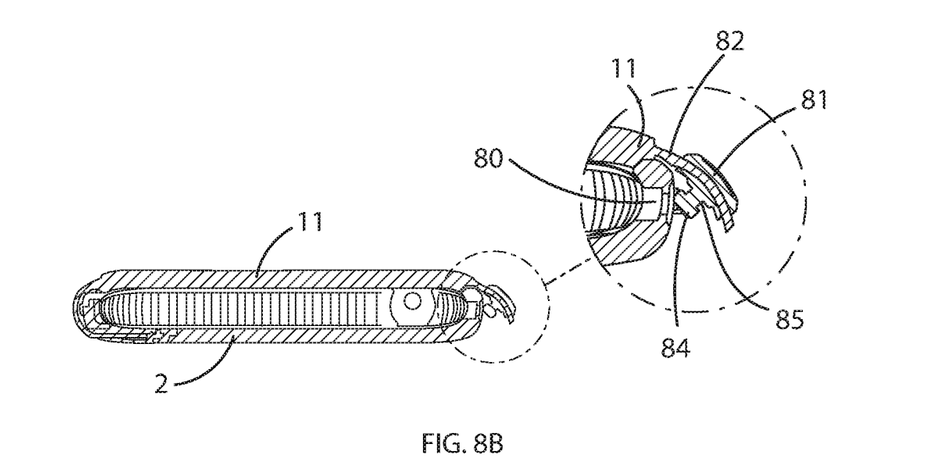
FIG. 8B is a view similar to FIG. 8A showing the fastening device partially closed.
Figure 8C:
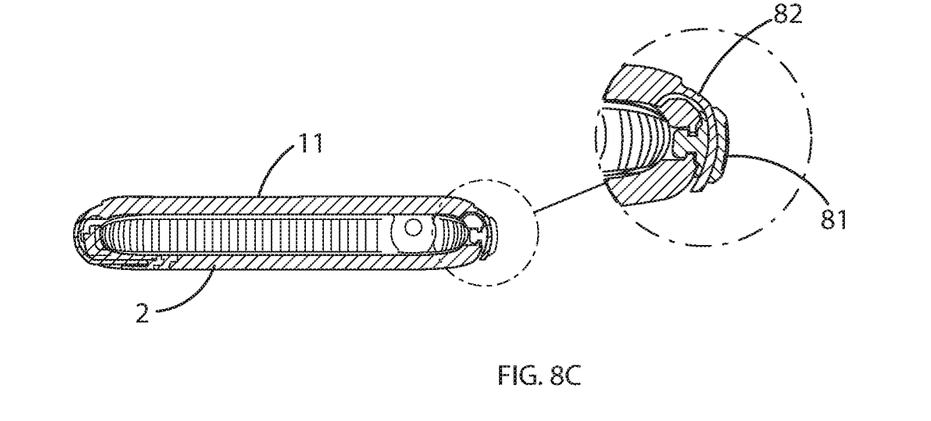
FIG. 8C is a view similar to FIGS. 8A and 8B showing the fastening device fully closed.

The latching mechanism is simply provided by a hole 80 in the right side 5 and a stud 81 attached to a tab 82 which, as is apparent from FIGS. 8A-8C is an extension of the flexible material forming the cover portion 11. The hole 80 has an elongate configuration as can be seen in FIG. 1. The stud 81 has a corresponding the elongate configuration.

The hole 80 extends fully through the side wall 5 and has an inwardly extending lip 83 to provide a narrow entranceway. The stud 81 may be a two part structure which is assembled around the tab 82. Alternatively, it may a single piece which is bonded in place. The stud may be PC, ABS, PC/ABS blends, Hard TPU grades, glass and fibre-filled rigid thermoplastics, nylon, glass and fibre-filled nylons and similar materials. It is provided with an enlarged head 34 facing the opening 30 with a narrow neck 85 being defined behind the large head 84. As can be seen, for example, in FIGS. 1, 8 and 8C, the tab 82 is relatively short and the fact that it engages in the hole 80 and the side wall 5 means that, even in the closed position it projects very little beyond the normal case footprint.

As can be seen from FIGS. 8A to 8C, when the cover is closed, the flexibility of the tab 82 will naturally call the stud 31 to move towards the opening or hole 80 to the position shown in FIG. 8B. It then simply requires a small amount of pressure from the finger or thumb of a user to press the head 84 past the lip 83 so that the head moves into the fully closed position as shown in FIG. 8C. As can be seen from this figure, the stud 81 will not interfere with the internal cavity occupied by the device. The lip 83 engages in the neck 85 behind head 84 to provide a robust closure. However, in order to release the cover, it is simply a matter of pulling the tab 82 a short distance overcoming the resilience of the lip 83 and releasing the tab to the position shown in FIG. 8B.

This arrangement provides a simple construction, ease of use, a robust connection and low profile fastener.

The invention claimed is:

1. A case for a mobile communications device with a screen, the case comprising main body and a cover;

the main body having a substantially rectangular configuration comprising a back wall with a top edge and a bottom edge and a pair of side edges extending substantially perpendicular to the top and bottom edges, top and bottom walls extend away from the top and bottom edges and side walls extend away from the side edges such that the four walls define (1) a rectangular opening in a front face of the main body, via which the mobile communications device is receivable, and (2) with the back wall, a cavity to receive a mobile communication device, the main body having a recess to which the cover engages;

the cover comprising a cover portion arranged to selectively cover the front of the cavity in a closed position and a connection portion having a connection projection, the connection projection engaging the recess in the main body to connect the cover portion to the main body so that the cover portion is movable between a closed position in which the cover portion covers the cavity and an open position in which the cavity is accessible;

the cover portion being formed, at least partially, of a flexible sheet of material, the free edge of the cover portion adjacent to the side wall opposite the connection portion being provided with a tab which is an extension of the flexible sheet material forming the cover portion;

a stud fastener being fixed to the tab;

one of the top wall, the bottom wall or one of the side wals of the main body adjacent to the tab with the cover in the closed position being provided with an opening;

the main body in the vicinity of the opening being formed of a first resilient material and the stud fastener being formed of a material which is harder than the first resilient material; and the opening being positioned, in use, so that when the cover portion is in the closed position over the mobile communications device, the tab has a closed cover disengaged tab position and a closed cover engaged tab position, in the closed cover disengaged tab position, the tab is not engaged with the opening, in the closed cover engaged tab position, the tab is engaged with the opening, transition between the closed cover disengaged tab position and closed cover engaged tab position occurs by moving the tab so that the stud fastener enters the opening and resiliently deforms the material in the vicinity of the opening to hold the stud fastener in the opening in a secured configuration.

2. The case according to claim 1, wherein the stud fastener comprises a connection head which projects from the side of the tab which faces the main body when the cover portion is in its closed position, and a neck portion in the form of a restriction between the head and the tab; the opening being provided with a narrow entrance and an enlarged portion behind the narrow entrance, wherein as the stud fastener is moved to the secured configuration the head enters the opening, resiliently deforming the material of the narrow entrance allowing the head to pass through the narrow entrance until the neck is located in the narrow entrance and is held in place by the resilience of the material.

3. A case for a mobile communications device with a screen, the case comprising:
   a main body and a cover;
   the main body having a substantially open front rectangular box shape comprising a back wall and a top, a bottom and two opposing side walls extending upward from the back wall, thereby defining a cavity to receive a mobile communications device via the open front, the main body having a recess to which the cover engages;
   the cover comprising a cover portion arranged to selectively cover the front of the main body over the cavity, when in a closed position, and a connection portion having a connection projection, the connection projection engaging the recess in the main body to connect the cover portion to the main body so that the cover portion is movable between a closed position and an open position in which the cavity is accessible;
   the cover portion being formed, at least partially, of a flexible sheet of material, a free edge of the cover portion adjacent to the side wall opposite the connection portion being provided with a tab which is an extension of the flexible sheet material forming the cover portion;
   a stud fastener being fixed to the tab;
   one of the top, the bottom or one of the side walls of the main body having an opening, in a location adjacent to the tab, when the cover portion is in its closed position;
   the main body in a vicinity of the opening being formed of a first resilient material and the stud fastener being formed of a material which is harder than the first resilient material; and
   the opening being disposed in a location such that, when the cover portion is in its closed position, the tab has a closed cover disengaged tab position and a closed cover engaged tab position, in the closed cover disengaged tab position, the tab is not engaged with the opening, and in the closed cover engaged tab position, the tab is engaged with the opening, transition between the closed cover disengaged tab position and closed cover engaged tab position occurs by moving the tab so that the stud fastener enters the opening and resiliently deforms the material in the vicinity of the opening to hold the stud fastener in the opening in a secured configuration.

4. The case according to claim 3, wherein the stud fastener comprises a connection head which projects from the side of the tab which faces the main body when the cover portion is in its closed position, and a neck portion in the form of a restriction between the head and the tab; the opening being provided with a narrow entrance and an enlarged portion behind the narrow entrance, wherein as the stud fastener is moved to the secured configuration the head enters the opening, resiliently deforming the material of the narrow entrance allowing the head to pass through the narrow entrance until the neck is located in the narrow entrance and is held in place by the resilience of the material.

\* \* \* \* \*